(12) United States Patent
Andreev et al.

(10) Patent No.: US 8,035,537 B2
(45) Date of Patent: Oct. 11, 2011

(54) METHODS AND APPARATUS FOR PROGRAMMABLE DECODING OF A PLURALITY OF CODE TYPES

(75) Inventors: Alexander Andreev, San Jose, CA (US);
Sergey Gribok, San Jose, CA (US);
Oleg Izyumin, Los Gatos, CA (US);
Ranko Scepanovic, Saratoga, CA (US);
Igor Vikhliantsev, San Jose, CA (US);
Vojislav Vukovic, Santa Clara, CA (US)

(73) Assignee: LSI Corporation, Milpitas, CA (US)

( * ) Notice: Subject to any disclaimer, the term of this patent is extended or adjusted under 35 U.S.C. 154(b) by 146 days.

(21) Appl. No.: 12/138,920

(22) Filed: Jun. 13, 2008

(65) Prior Publication Data

US 2009/0309770 A1    Dec. 17, 2009

(51) Int. Cl.
*H03M 7/00* (2006.01)
(52) U.S. Cl. ............................................ 341/81; 455/81
(58) Field of Classification Search .................. 341/81; 455/12.1, 21; 375/200; 370/242; 714/755, 714/763
See application file for complete search history.

(56) References Cited

U.S. PATENT DOCUMENTS

| | | | | |
|---|---|---|---|---|
| 5,734,962 A * | 3/1998 | Hladik et al. | ................ | 455/12.1 |
| 6,205,187 B1 * | 3/2001 | Westfall | ................ | 375/341 |
| 6,674,971 B1 * | 1/2004 | Boggess et al. | ................ | 398/139 |
| 7,616,719 B1 * | 11/2009 | Narasimhan | ................ | 375/346 |
| 2002/0029364 A1 * | 3/2002 | Edmonston et al. | ........... | 714/755 |

OTHER PUBLICATIONS

Dielissen et al., "Multistandard FEC Decoders for Wireless Devices," IEEE Transactions on Circuits and Systems, II: Express Briefs [Online], vol. 55, No. 3 (Mar. 3, 2008).

Anonymous, "SIMD Viterbi Decoder," Internet Article [Online], http://freshmeat.net/projects/simd-vit, downloaded on Mar. 25, 2008.

Pryanishnikov et al., "Compiler Optimizations for Processors with SIMD Instructions," Internet Article [Online] 2007, downloaded on Mar. 25, 2008, http://www3.interscience.wiley.com/cgi.

Viterbi, A.J., "An Intuitive Justification and a Simplified Implementation of the MAP Decoder for Convolutional Codes," IEEE Journal on Selected AReas in Communications, vol. 16, No. 2, pp. 260-264 (Feb. 1998).

Bickerstaff et al., "A Unified Turbo/Viterbi Channel Decoder for 3GPP Mobile Wireless in 0.18 -μm CMOS," IEEE Journal of Solid-State Circuits, vol. 37, No. 11, pp. 1555-1564 (Nov. 2002).

(Continued)

*Primary Examiner* — Joseph Lauture
(74) *Attorney, Agent, or Firm* — Ryan, Mason & Lewis, LLP

(57) ABSTRACT

Methods and apparatus are provided for programmable decoding of a plurality of code types. A method is provided for decoding data encoded using one of a plurality of code types, where each of the code types correspond to a communication standard. The code type associated with the data is identified and the data is allocated to a plurality of programmable parallel decoders. The programmable parallel decoders can be reconfigured to decode data encoded using each of the plurality of code types. A method is also provided for interleaving data among M parallel decoders using a communications network. An interleaver table is employed, wherein each entry in the interleaver table identifies one of the M parallel decoders as a target decoder and a target address of a communications network for interleaved data. Data is interleaved by writing the data to the target address of the communications network. The communications network can comprise, for example, a cross-bar switch and/or one or more first-in-first-out buffers.

18 Claims, 7 Drawing Sheets

OTHER PUBLICATIONS

Berrou et al., "Near Shannon Limit Error—Correcting Coding and Decoding: Turbo Codes (1)," in Proc. IEEE Int. Conf. Commun., pp. 1064-1070 (1993).

Cavallaro et al., "Viturbo: A Reconfigurable Architecture for Viterbi and Turbo Decoding," Proc. IEEE Int. Conf. on Acoustics, Speech, and Signal Processing (2003).

Shin et al., "Programmable Turbo Decoder Supporting Multiple Third-Generation Wireless Standards," IEEE Int. Solid-State Circuits Conf., pp. 154-155 (Feb. 2003).

"3rd Generation Partnership Project; Technical Specification Group Radio Access Network; Evolved Universal Terrestrial Radio Access (E-UTRA); Multiplexing and Channel Coding (Release 8)," 3GPP TS 36.212, V8.1.0 (Nov. 2007).

* cited by examiner

| INTERLEAVER TABLE | |
|---|---|
| 0 | 0 |
| 1 | 171 |
| 2 | 218 |
| 3 | 141 |
| ⋮ | |
| 243 | 13 |
| 244 | 60 |
| 245 | 231 |
| 246 | 30 |
| 247 | 201 |

TABLE 1

TABLE 2

TABLE 3

FIG. 6D

| LOCAL REVERSED INTERLEAVER TABLES FOR 4 COMPUTATION CLUSTERS | | | | |
|---|---|---|---|---|
| | 0 | 1 | 2 | 3 |
| 0: | [0,0] | [2,0] | [0,8] | [2,8] |
| 1: | [1,31] | [3,31] | [1,39] | [3,39] |
| 2: | [1,2] | [3,2] | [1,10] | [3,10] |
| 3: | [2,33] | [0,41] | [2,41] | [0,49] |
| ⋮ | | | | |
| 59: | [0,25] | [2,25] | [0,33] | |
| 60: | [3,52] | [1,60] | [0,4] | |
| 61: | [1,27] | [3,27] | [1,35] | |
| 62: | [0,62] | [2,62] | [1,6] | |
| 63: | [2,29] | [0,37] | [2,37] | |

TABLE 4

METHODS AND APPARATUS FOR PROGRAMMABLE DECODING OF A PLURALITY OF CODE TYPES

FIELD OF THE INVENTION

The present invention relates generally to error correction coding techniques for digital communications, and more particularly, to techniques for parallel decoding and interleaving of a plurality of codes, such as convolutional and turbo codes

BACKGROUND OF THE INVENTION

FIG. 1 is a block diagram of a typical digital communication system 100. As shown in FIG. 1, a digital source 110 produces a sequence of binary messages. Thereafter, an exemplary channel encoder 120 uses a forward error-correction coding scheme, to increase the redundancy of the source messages and to transform the source messages into encoded messages (often referred to as codewords). Generally, the error correction coding provides increased resilience to channel noise. A modulator 130 transforms the encoded messages into signals that are appropriate for transmission over a channel 140. These signals enter the channel 140 and are typically corrupted by noise and interference on the channel.

At the receiver, a demodulator 150 receives the noisy signals from the channel 140 and converts the received signals into blocks of symbols. A channel decoder 160 exploits the redundancy introduced by the channel encoder 120 to attempt to correct any errors added by the channel 140 and to restore the original messages. A number of different decoding techniques have been proposed or suggested to decode signals encoded using error correction codes Error correction encoding techniques for wireless communication systems often employ convolutional or turbo coding of the data before the signal is modulated so that errors introduced by noise and interference on the channel may be corrected. Generally, a convolutional code is an error correction code where each m-bit string is transformed into an n-bit symbol, where m/n is the code rate (n is greater than or equal to m) and the transformation is a function of the previous k information symbols, where k is the constraint length of the code. Turbo codes are another class of error correction codes that are said to approach the theoretical limits imposed by Shannon's theorem with reduced decoding complexity relative to the convolutional codes that would be required for similar performance.

Increasingly, communication devices must support multiple communication standards. For example, each of the WiMAX (Worldwide Interoperability for Microwave Access) (an IEEE 802.16 wireless broadband standard), LTE (Long Term Evolution) (a 3GPP 4G technology), UMB (Ultra Mobile Broadband) (a CDMA Development Group and 3rd Generation Partnership Project 2) and WCDMA (Wideband Code Division Multiple Access) communication standards require support for at least one convolutional encoding technique and at least one convolutional turbo encoding technique (or a combination thereof), at one or more rates.

Thus, a need exists for reconfigurable or programmable decoders that can support multiple communication standards. A further need exists for a programmable coder/decoder (codec) that supports encoding or decoding (or both) and symbol processing functions for a number of different existing and future communication standards.

SUMMARY OF THE INVENTION

Generally, methods and apparatus are provided for programmable decoding of a plurality of code types. According to one aspect of the invention, a method is provided for decoding data encoded using one of a plurality of code types, where each of the code types correspond to a communication standard. The decoding method comprises the steps of identifying the code type associated with the data; allocating the data to a plurality of programmable parallel decoders, wherein the programmable parallel decoders can be reconfigured to decode data encoded using each of the plurality of code types; and providing the data and the associated code type to the allocated programmable parallel decoders. Program code (for example, from a local memory) can be loaded into one or more of the programmable parallel decoders based on the identified code type.

According to another aspect of the invention, a method is provided for generating one or more interleaver tables for use by M parallel decoders that decode data of at least one code type. The interleaver table generation method comprises the steps of generating a first interleaver table based on a communication standard for the at least one code type; and dividing the first interleaver table by M to create a second interleaver table having M clusters, wherein each entry in the second interleaver table indicates one of the M parallel decoders as a target decoder and a target address for interleaved data. The data can then be interleaved among the M parallel decoders using a communications network.

According to yet another aspect of the invention, a method is provided for interleaving data among M parallel decoders. The interleaving method comprises the steps of reading data to be decoded; accessing an interleaver table, wherein each entry in the interleaver table identifies one of the M parallel decoders as a target decoder and a target address of a communications network for interleaved data; and writing the data to the target address of the communications network. The communications network can comprise, for example, a crossbar switch and/or one or more first-in-first-out buffer.

A more complete understanding of the present invention, as well as further features and advantages of the present invention, will be obtained by reference to the following detailed description and drawings.

BRIEF DESCRIPTION OF THE DRAWINGS

FIG. 5 is a schematic block diagram of an exemplary computation cluster of FIG. 4 that incorporates features of the present invention; and FIGS. 6A through 6D illustrate four sample interleaving tables.

DETAILED DESCRIPTION

Figure 1:
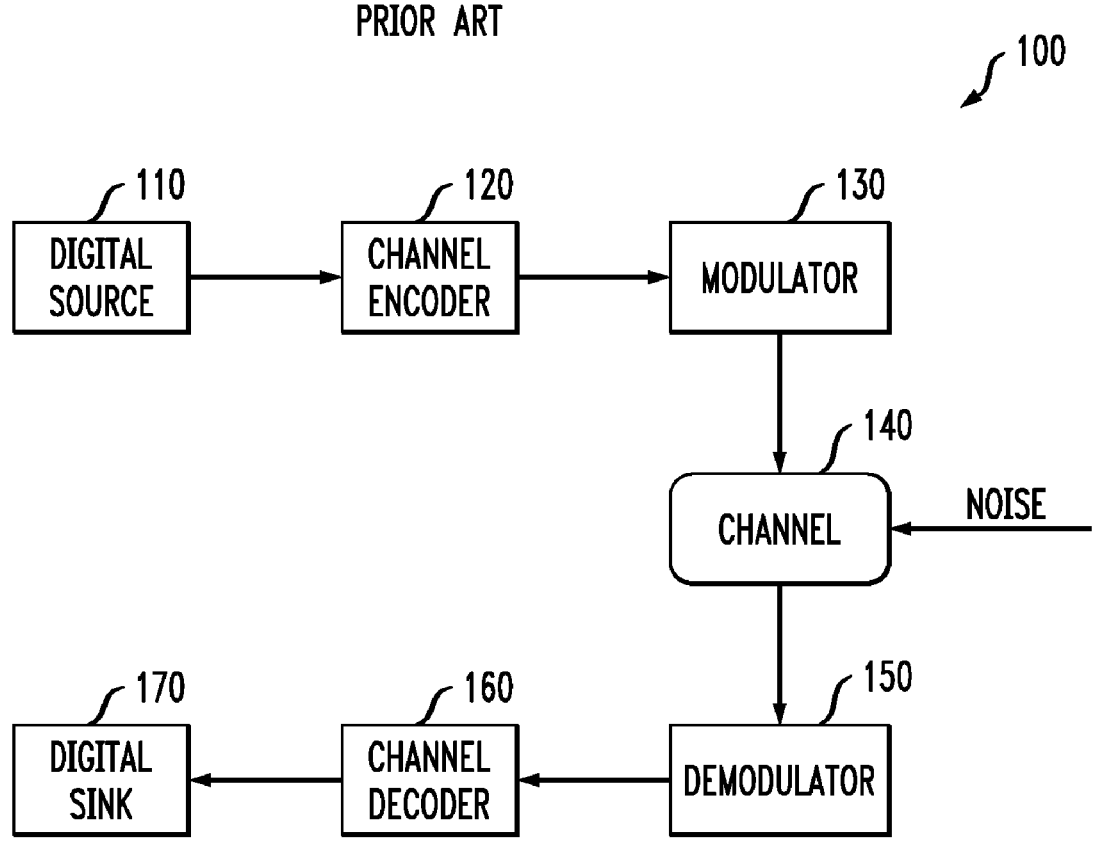
FIG. 1 is a block diagram of a typical digital communication system.

Aspects of the present invention provide programmable decoders that support a plurality of communication standards. According to one aspect of the present invention, the conventional channel decoder 160 of FIG. 1 is modified to provide a decoder function for a plurality of encoding techniques. In one exemplary embodiment, the conventional channel decoder 160 of FIG. 1 is modified to provide a decoder function for the WiMAX, LTE and UMB error correction protocols. According to another aspect of the invention, the conventional channel decoder 160 of FIG. 1 performs a number of symbol processing functions, such as puncturing and de-puncturing, cyclic redundancy check (CRC) generation and checking, interleaving and de-interleaving, and multiplexing and de-multiplexing, that are required by the supported communication standards.

For a general discussion of encoding techniques using convolutional and turbo codes, see, for example, IEEE 802.16 Wireless Broadband Standard, as described in:

http://standards.ieee.org/getieee802/download/802.16-2004.pdf, or http://standards.ieee.org/getieee802/download/802.16e-2005.pdf (WiMAX); or the 3rd Generation Partnership Project Technical Specification, as described in:

http://www.3gpp.org/ftp/Specs/archive/36_series/36.212/36212-810 zip (LTE), or http://www.3gpp2.org/Public_html/specs/C.S0084-001-0_v2.0_070904.pdf (UMB), each incorporated by reference herein According to yet another aspect of the present invention, a plurality of programmable "thread processors" are employed to support a number of convolutional and turbo-like codes. In addition, a communication network is used for interleaving instead of one or more dedicated interleaver/de-interleaver modules to reduce the processing time.

Decoding Basics

A decoder, such as the decoder 160 of FIG. 1, can process codewords on a frame-by-frame basis. Each frame is comprised of several codewords that require the same code operation type. Codewords are added to a frame in the order that they are received and the results are returned in the same order.

Decoding Convolutional Codes

A number of algorithms exist for decoding convolutional codes. For relatively small values of k (where k is the constraint length of the code), the Viterbi algorithm is frequently used, since it provides maximum likelihood performance and allows a parallel implementation. Generally, for longer codewords, a codeword can be divided into parts and decoded in parallel, as is well known to those of ordinary skill in the art. Parallel decoding is typically done to improve the decoding rate. Typically, overlapping windows are employed, where the codeword is divided into parts and decoded in parallel by a number of decoding units. Therefore, the decoder distributes the decoding tasks between a number of constituent decoding units. The decoder receives several code blocks and assigns the code blocks into the decoding units. The decoding units perform the decoding tasks in parallel and then the decoder retrieves the decoding results.

For a detailed discussion of techniques for assigning code blocks to constituent decoding units in a turbo decoding system having parallel decoding units, see, U.S. patent application Ser. No. 12/169,703, entitled "System and Method for Assigning Code Blocks to Constituent Decoder Units in a Turbo Decoder System Having Parallel Decoding Units," incorporated by reference herein.

For larger values of k, the codes are typically decoded with one of several known sequential decoding algorithms, such as the well-known Fano algorithm. See, for example, R M Fano "A heuristic Discussion of Probabilistic Decoding" (1963), incorporated by reference herein. Unlike Viterbi decoding, sequential decoding techniques do not employ maximum likelihood techniques, but the complexity increases only slightly with constraint length, allowing the use of strong, long-constraint-length codes.

Viterbi and sequential decoding algorithms generate hard-decisions, indicating the bits that form the most likely codeword. An approximate confidence measure can optionally be added to each bit by use of the well-known Soft Output Viterbi Algorithm (SOVA). Maximum a posteriori (MAP) soft-decisions for each bit can be obtained by use of the BCJR algorithm (Bahl-Cocke-Jelinek-Raviv Algorithm). See, for example, L Bahl et al, "Optimal Decoding of Linear Codes for Minimizing Symbol Error Rate," (March, 1974), incorporated by reference herein.

Figure 2:
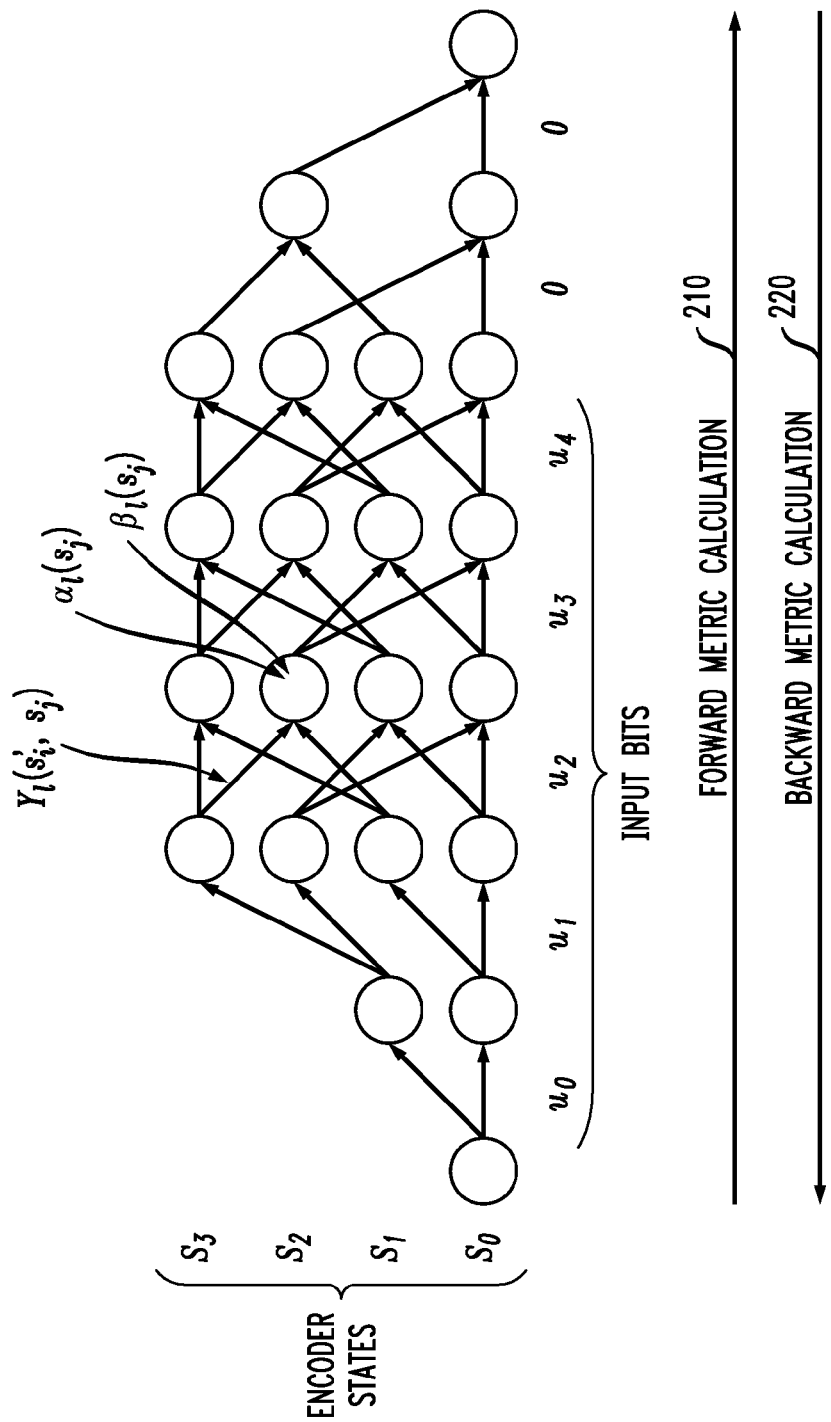
FIG. 2 is a schematic block diagram of an exemplary trellis employed by a conventional MAP decoder for decoding convolutional codes.

FIG. 2 is a schematic block diagram of an exemplary trellis 200 employed by a conventional MAP decoder for decoding convolutional codes. The exemplary trellis 200 can be used, for example, by a MAP decoder that computes a forward state metric 210 and a backward state metric 220, in a known manner, to calculate an output L-value. FIG. 2 illustrates the computation of such path metrics for a number of encoder states, $s_0$ through $s_3$, for a number of input bits, such as bits $u_0$ through $u_3$.

As shown in FIG. 2, the branch metrics, $\gamma_l(s',s)$, may be computed as follows:

$$\gamma_l(s', s) = \begin{cases} \frac{1}{2}(-L_l^{in} - y_l^0 - y_l^1), & \{s',0\} \to \{s, 0\} \\ \frac{1}{2}(-L_l^{in} - y_l^0 + y_l^1), & \{s',0\} \to \{s, 1\} \\ \frac{1}{2}(+L_l^{in} + y_l^0 - y_l^1), & \{s',1\} \to \{s, 0\} \\ \frac{1}{2}(+L_l^{in} + y_l^0 + y_l^1), & \{s',1\} \to \{s, 1\} \end{cases}$$

The forward metric, $\alpha_l(s)$, may be computed as follows:

$$\alpha_0(s) = \begin{cases} 0, & s = 0 \\ -\infty, & s \neq 0 \end{cases}$$

$$\alpha_{l+1}(s) = \max{}^* [\gamma_l(s_i', s) + \alpha_l(s_i'), \gamma_l(s_j', s) + \alpha_l(s_j')]$$

The backward metric, $\beta_l(s')$, may be computed as follows:

$$\beta_K(s) = \begin{cases} 0, & s = 0 \\ -\infty, & s \neq 0 \end{cases}$$

$$\beta_l(s') = \max{}^* [\gamma_l(s', s_i) + \beta_{l+1}(s_i), \gamma_l(s', s_j) + \beta_{l+1}(s_j)]$$

The Output L-value, $L(u_l)$, may be computed as follows:

$$L(u_l) = \ln\left[\frac{P(u_l = +1 \mid r)}{P(u_l = -1 \mid r)}\right]$$

$$L(u_l) = \max{}^*_{(s,s) \in \Sigma_l^+} \left[\begin{array}{c} \beta_{l+1}(s) + \\ \gamma_l(s', s) + \alpha_l(s') \end{array}\right] - \max{}^*_{(s,s) \in \Sigma_l^-} \left[\begin{array}{c} \beta_{l+1}(s) + \\ \gamma_l(s', s) + \alpha_l(s') \end{array}\right]$$

$$\max{}^* (x, y) = \ln(e^x + e^y) = \max(x, y) + \ln(1 + e^{-|x-y|})$$

Decoding Turbo Codes

Figure 3:
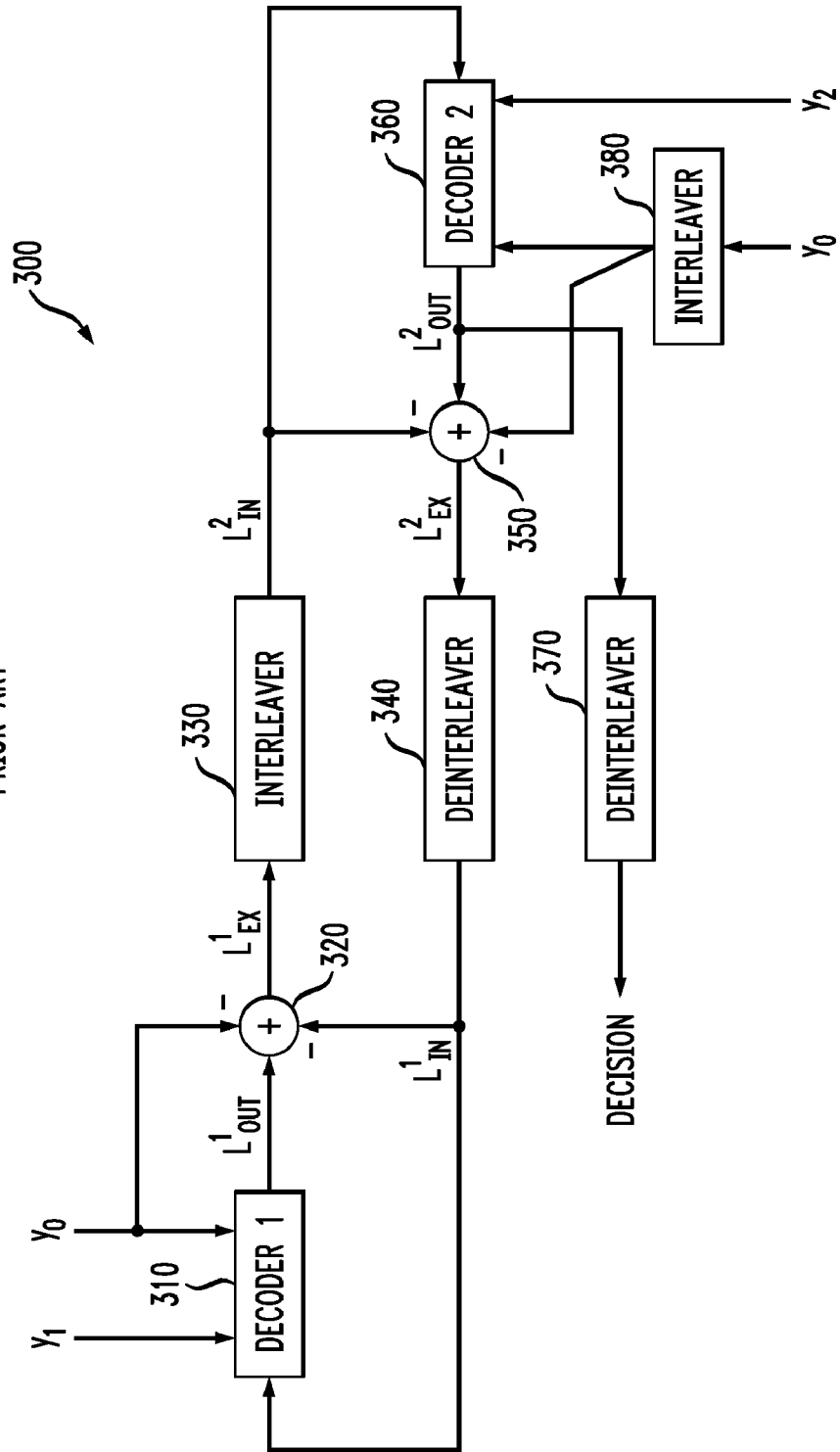
FIG. 3 is a block diagram of an exemplary conventional iterative conventional algorithm 300 for decoding turbo codes.

FIG. 3 is a block diagram of an exemplary conventional iterative conventional algorithm 300 for decoding turbo codes. As previously indicated, turbo codes are used in a number of data communication standards, such as 3G, 4G and IEEE 802.16. In the exemplary embodiment shown in FIG. 3, the received code block is divided into 3 parts: $(y_0, y_1, y_2)$. Vectors $(y_0, y_1)$ are sent to a first MAP-decoder 310. The MAP-decoder 310 produces a vector $L^1_{out}$, where $L^i_{out}$ is the output L-value of i-th decoder (a posteriori L-value).

The vector $L^1_{out}$ is added by an adder 320 to a vector $L^1_{in}$ generated by a de-interleaver 340 (discussed below) to generate a vector $L^1_{ex}$. $L^i_{ex}$ is the extrinsic L-value of i-th decoder (extrinsic a posteriori L-value). $L^i_{in}$ is the input L-value of i-th decoder. The vector $L^1_{ex}$ is applied to an interleaver 330. Generally, the interleaver 330 performs some mixing of the vector components. The output of the interleaver 330 is a vector $L^2_{in}$. The vector $L^2_{in}$ and vectors $(y_0, y_2)$ are applied to a second MAP-decoder 380. The MAP-decoder 380 produces a vector $L^2_{out}$. The vector $L^2_{out}$ is added by an adder 350 to the vector $L^2_{in}$ generated by interleaver 330 to generate a vector $L^2_{ex}$. The vector $L^2_{ex}$ is applied to the de-interleaver 340. The de-interleaver 340 performs a transformation that is an inverse to the operation performed by interleaver 330. The output of the de-interleaver 340 is the vector $L^1_{in}$, discussed above. The vector $L^1_{in}$ and vectors $(y_0, y_1)$ are applied to the first MAP-decoder 310 and continues in an iterative manner. The vector $L^2_{out}$ generated by the MAP-decoder 380 is also applied to a second de-interleaver 370, which generates the bit decisions. This iterative process stops after a fixed number of iterations or if some specific stopping criteria is satisfied.

For a more detailed discussion of suitable decoding algorithms 300, see, for example, Shu Lin, Daniel Costello, "Error Control Coding," (2d Ed., 2004), incorporated by reference herein. Generally, the decoding algorithms 300 typically support code blocks of different sizes. For example, according to the 3GPP standard, the source message size can vary from 40 to 5114 bits. The decoding algorithms 300 should efficiently handle a data flow that consists of code blocks of different sizes. In addition, the total time needed to decode a code block is proportional to the code block size. The total size of the random-access memory inside the decoder 160 is proportional to the size of maximum code block that the decoder 160 can support.

Programmable Decoder

Figure 4:
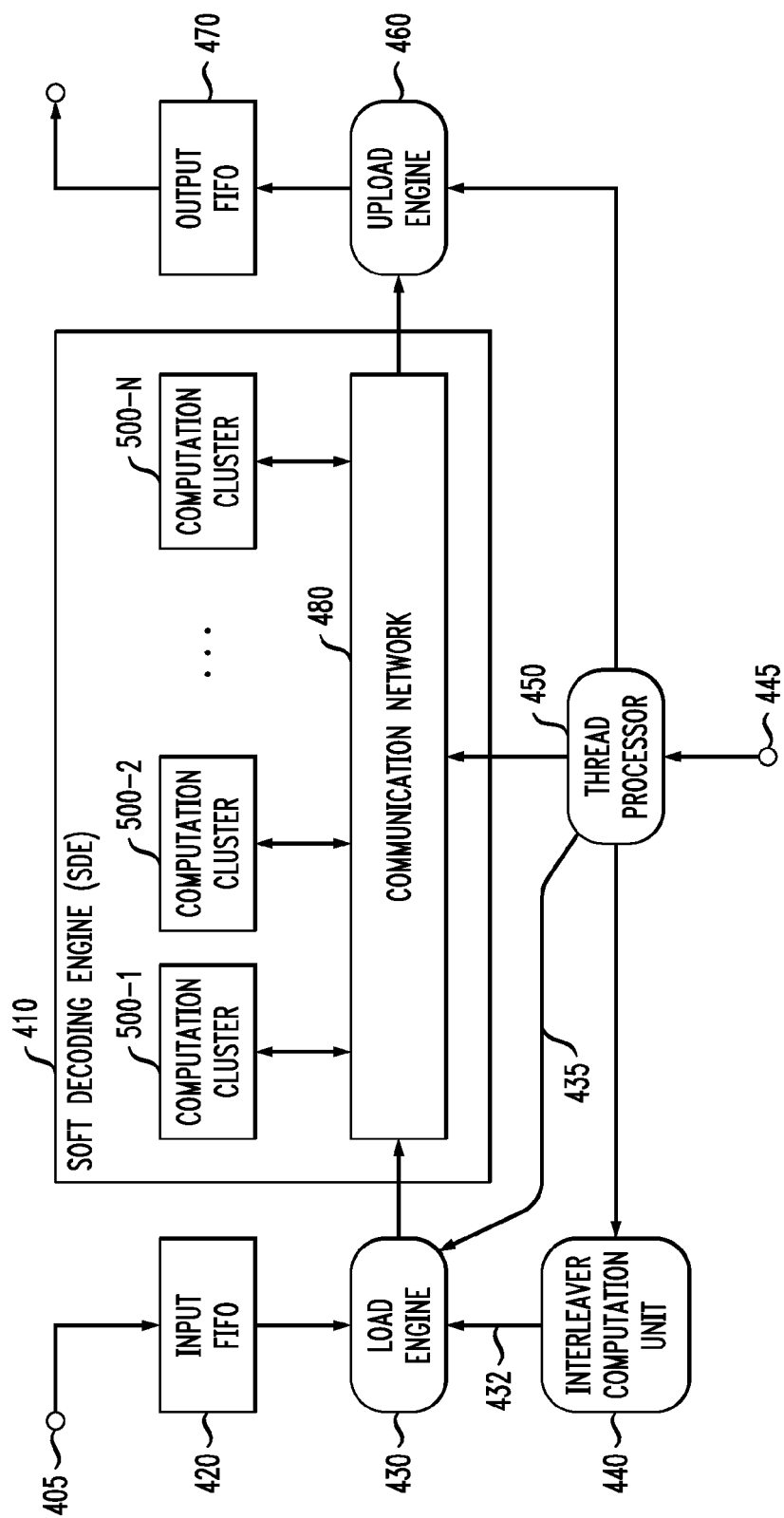
FIG. 4 is a schematic block diagram of a decoder incorporating features of the present invention.

FIG. 4 is a schematic block diagram of a decoder 400 incorporating features of the present invention. As shown in FIG. 4, the decoder 400 comprises a soft decoding engine (SDE) 410, an input first-in-first-out (FIFO) buffer 420, a load engine 430, an interleaver computation unit 440, a thread processor 450, an upload engine 460 and an output FIFO buffer 470. In addition, as shown in FIG. 4, the soft decoding engine 410 comprises a communication network 480, used for interleaving in a manner discussed below, and a plurality of computation clusters 500-1 through 500-N (collectively referred to herein as computation clusters 500), discussed further below in conjunction with FIG. 5.

The soft decoding engine 410 decodes a plurality of codes in accordance with an aspect of the present invention, such as turbo codes, convolution codes, and LDPC codes. In addition, the soft decoding engine 410 may be configured to simultaneously decode several code words at the same time.

The input FIFO buffer 420 stores the data that is coming into the decoder 400 from an input port 405. The load engine 430 receives the input data for several codewords from the FIFO 420. In addition, the load engine 430 reads the interleaved addresses for the data from the interleaver computation unit 440 by means of connection 432, receives control signals from the thread processor 450 by means of connection 435 and sends the data to the communication network 480.

The thread processor 450 may be implemented, for example, using a Coware processor (see, http://www.coware.com/).

The interleaver computation unit 440 generates one or more interleaver tables 600, discussed further below in conjunction with FIGS. 6A through 6D, containing destination addresses that are used by the computation clusters 500 to write the data for the next half iteration.

As previously indicated, the thread processor 450 generates a command stream for the decoding algorithms in the computation clusters 500 based on the program memory content. The thread processor 450 receives control information from input port 445 with the data that is received on port 405. The control information comprises headers and configuration data that defines the communication standard that was used to encode the data. For example, the control information may specify the type of code (code type identifier), the number of codewords in a frame and the codeword length. As discussed hereinafter, the thread processor 450 provides the appropriate information to the computation clusters 500 via the communication network 480. If the thread processor 450 determines that a new code type needs to be decoded the thread processor 450 will send the parameters to the computation clusters 500 with a code type identifier. As discussed further below in conjunction with FIG. 5, the computation clusters 500 will load the appropriate program code, if needed, to decode the codeword based on the code type identifier.

The input FIFO butter 420 stores the data that is coming into the decoder 400 from an input port 405. The upload engine 460 receives the decoded data from the communication network 480 and applies it to the output FIFO buffer 470.

The communication network 480 provides arbitrary configurable connections between components, such as the thread processor 450 and the computation clusters 500. In one exemplary embodiment, the communication network 480 can be implemented as a cross-bar switch or FIFOs. The operation of the communication network 480 is discussed further below in the section entitled "Parallel Interleaving."

Figures 5, 6A:
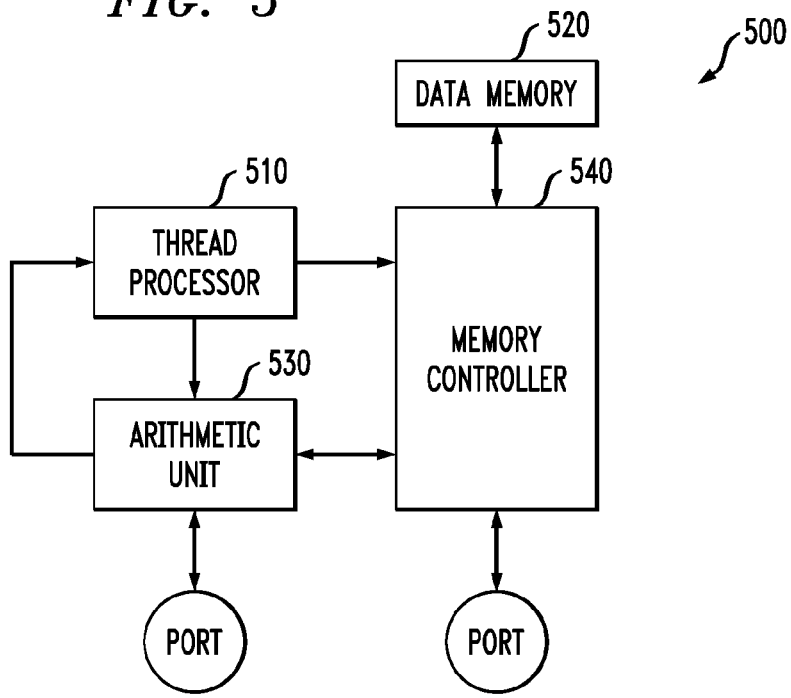

FIG. 5 is a schematic block diagram of an exemplary computation cluster 500 that incorporates features of the present invention. As previously indicated, a plurality of computation clusters 500 decodes the data in parallel. As shown in FIG. 5, the exemplary computation cluster 500 comprises a thread processor 510, a data memory 520, an arithmetic unit 530 and a memory controller 540.

As previously indicated, the thread processor 450 of FIG. 4 provides the appropriate control information to the computation clusters 500 via the communication network 480. If the thread processor 450 determines that a new code type needs to be decoded, the thread processor 450 will send the parameters to the computation clusters 500 with a code type identifier. Based on the code type identifier, the thread processor 510 in the computation cluster 500 will load the appropriate program code, if needed, from the data memory 520 (via the memory controller 540) to decode the codeword based on the code type identifier. The decoding operations performed by the thread processor 510 are discussed further below in a section entitled "Parallel Decoding." Generally, reads are local and writes are performed according to interleaver tables 700. The data memory 520 stores a plurality of programs for decoding codewords associated with a plurality of different communication standards.

The thread processor 510 interprets a program and according to the program provides instructions for the arithmetic unit 530. Generally, based on the identified communication standard, such as LTE, the thread processor 510 in each cluster 500 is loaded with the appropriate program code from the data memory 520, as well as the interleaver tables 700 and other parameters for the identified standard (based on, for example, the indicated codeword size). Thereafter, the computation cluster 500 can decode all codewords received that have been encoded with the same standard.

Parallel Decoding

As discussed above in conjunction with FIG. 3, the decoding process is typically an iterative process. In the exemplary embodiment of the present invention, there are four computation clusters 500 operating in parallel, and the computation clusters 500 perform two sets of operations during each iteration. During the first half iteration (Decoder 1 in FIG. 3), the computation clusters 500 read their own local port of data (e.g., the received vector, for example, from the data memory 520) and $L^1_{in}$ (see FIG. 3) and obtain the target address of the data cluster from the interleaver table(s) 700 (Table 3), as discussed further below in the following section. Thereafter, the computation clusters 500 interleave the data in accordance with the present invention by writing the data to the communication network 480 using the indicated target address. In this manner, the data is decoded by the computation clusters 500 and sent to the communication network 480, but is not stored locally by the computation clusters 500. The data is sent to the target address and is not needed until the next half iteration.

During the second half iteration (Decoder 2 in FIG. 3), the computation clusters 500 again read their own local port of data (e.g., the received vector, for example, from the data memory 520) and $L^2_{in}$ (see FIG. 3) and obtain the target address of the data cluster from the interleaver table(s) 700 (Table 4), as discussed further below in the following section. Thereafter, the computation clusters 500 de-interleave the data in accordance with the present invention by writing the data to the communication network 480 using the indicated target address.

Parallel Interleaving Using Communications Network

Figure 6B:
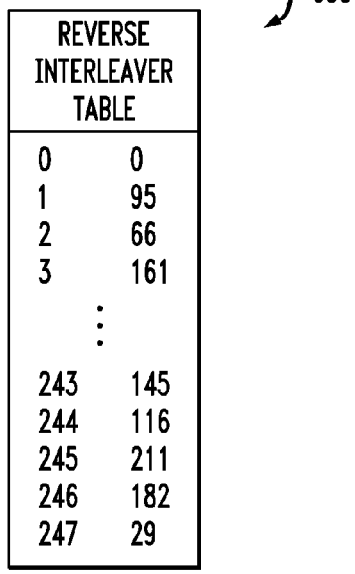

FIGS. 6A through 6D illustrate four sample interleaving tables 600. FIGS. 6A and 6B illustrate conventional interleaver and de-interleaver tables for LTE Turbo codes having a codeword size, K=248. The tables in FIGS. 6A and 6B are generated based on the corresponding standard document. The exemplary tables were generated using the algorithm specified in Section 5.1.3.2.3 of http://www.3gpp.org/ftp/Specs/archive/36_series/36.212/36212-810.zip. The parameters $f_1$ and $f_2$ depend on the block size K and are summarized in Table 5.1.3-3 of the LTE standards document.

In this example, the codeword size, Ki, is 248, and thus Table 5.1.3-3 from the standards document specifies that parameters f1=33 and f2=62. These values are used to populate the interleaver table of FIG. 6A and the de-interleaver table of FIG. 6B. Therefore, input index i and output index j of the interleaver table 600 satisfies the following equation:

$$i=(33*j+62*j^2) \bmod 248$$

The exemplary interleaver table of FIG. 6A (Table 1) has two columns. The first column is an input data index. The second column is an output (interleaved) data index. For example, the first two rows of the table in FIG. 6A are:

| 0 | 0 |
|---|---|
| 1 | 171 |

This notation indicates that after the interleaving (i.e., writing to the communications network 480 in accordance with the present invention), the 0-th data word remains at index 0 while the first (1-st) data word goes to index 171.

Likewise, the exemplary de-interleaver table of FIG. 6B (Table 2), often referred to as a "reversed interleaver table," is a reversed copy of the interleaver table of FIG. 6A. For example, the first line (row two) of the interleaver table (FIG. 6A) is "1 171". Therefore, the 171-st line of the second table is "171 1". This notation indicates that after the de-interleaving (i.e., writing to the communications network 480 in accordance with the present invention), the 171-st data word is written to index 1. As previously indicated, embodiments of the present invention employ a plurality of parallel programmable thread processors 510 to support a number of convolutional and turbo-like codes. In the exemplary embodiment, there are M equal to 4 parallel computation clusters 500. In addition, a communication network 480 is used for interleaving the decoding processes performed by the parallel thread processors 510.

Figure 6C:
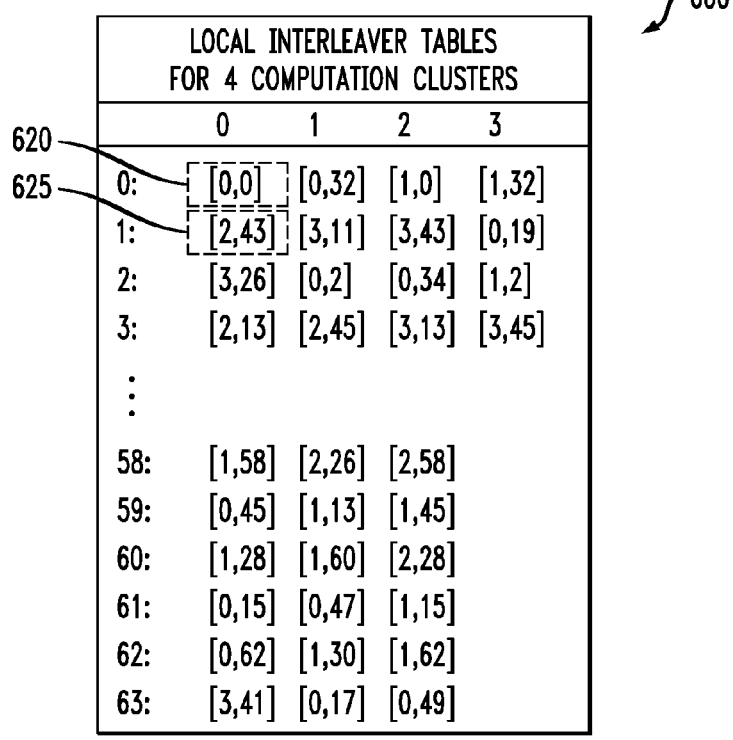

FIGS. 6C and 6D illustrate interleaver and de-interleaver tables for LTE Turbo codes having a codeword size, K=248, and a parallel decoder implementation, where M is equal to 4. Generally, interleaver and de-interleaver tables in FIGS. 6C and 6D are generated by dividing the original tables of FIGS. 6A and 6B by M (equal to 4) to create four clusters. In this manner, the interleaver and de-interleaver tables of FIGS. 6C and 6D allow the interleaving process to be divided for a parallel decoding implementation.

In FIG. 6C, the format is {<target cluster index> <target memory address>}. Thus, in the notation of FIG. 6C, for example, the first entry 620 corresponds to the first entry of FIG. 6A and again indicates that the 0-th data word remains at index 0 for Cluster 0. Likewise, the second entry 625 indicates that the first word (correspond to row 1) goes to index 43 of Cluster 2 (corresponding to the second entry of "1 171" from FIG. 6A for a mod 64 operation).

Likewise, the exemplary de-interleaver table of FIG. 6D (Table 4), often referred to as a "reversed interleaver table for 4 computation clusters," is a reversed copy of the interleaver table of FIG. 6C. Generally, the de-interleaver table of FIG. 6D returns data to the original position, in a known manner.

Functional Decoding Mode

A decoder 400 (FIG. 4) must typically be initialized before the decoders enters a functional mode. During the initialization procedure, the decoder 400 is programmed for its regular operations, in a known manner. Generally, during the initialization procedure, the thread processors 510 (FIG. 5) are loaded with the appropriate programs for the communications standard, as well as the data that will be decoded during the functional mode. As the boot data start and continue to arrive to the input FIFO 420, the decoder initialization part reads the data and loads the selected thread processors 510. When the boot process is finished, the decoder sets its status register to a predefined value and is then ready to start processing received frames.

In the functional mode, an outside block typically sends a data frame to the decoder and monitors the status register for the finish of the processing. When the results are ready, they are taken outside and a new frame can be sent to the decoder.

As previously indicated, a frame is comprised of several codewords with the same decoding operation type. To indicate that a new frame is ready, one or more flags may be set for one clock cycle. Thereafter, the decoder 400 expects to receive a set of headers followed by the data for every codeword in the frame.

In one exemplary embodiment, the first header that sent to the decoder 400 is a frame title header (e.g., indicating operation type (format) and the number of codewords in the frame). Thereafter, the decoder receives a group of headers, with one header for each codeword in the frame.

An Exemplary Frame Codeword Header Indicates:

| Field | Meaning |
| --- | --- |
| Codeword length | A number of information bits in a codeword |
| Address | A decoder memory address where the codeword will be placed |
| Processor ID | ID of a first thread processor that will process the codeword |
| Number of addresses | A number of addresses that the codeword will occupy |
| Number of processors | A number of thread processors that will process the codeword |
| Thread processor data | The thread processor parameters used for the codeword processing |

After the codeword headers, headers can be sent containing the thread processor parameters for all the thread processors 510 in the decoding engine. First, a title header can be sent for as many cycles as necessary to specify the number of codewords each thread processor 510 is going to process:

An Exemplary Thread Processor Title Header Indicates:

| Field | Meaning |
| --- | --- |
| Number of CWs | |
| Processor ID | ID of a thread processor |
| Number of codewords | A number of codewords the thread processor will process |

Then, it is sent one header for each thread processor codeword

| Field | Meaning |
| --- | --- |
| Processor ID | ID of a thread processor |
| Codeword ID | ID of a thread processor's codeword |
| Address | Starting memory address of the codeword |
| Number of addresses | A number of addresses that the codeword will occupy |
| Thread processor data | The thread processor parameters used for the codeword processing |

After all the headers are received, the decoder 400 receives the codeword data in accordance with the information in the headers. It is assumed in the exemplary embodiment that the soft values take 8 bits of the data so it is possible to receive at most 16 soft values in one clock cycle. After the complete frame is decoded, the decoder sets the value of status register to a predefined value, such as 'DONE', and the data can be taken from the output FIFO 470.

Conclusion

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A method for decoding data encoded using one of a plurality of code types, each of said code types corresponding to a communication standard, said method comprising:
   identifying said code type associated with said data;
   loading program code associated with said identified code type into one or more of a plurality of programmable parallel decoders;
   allocating said data to said plurality of programmable parallel decoders, wherein said programmable parallel decoders can be reconfigured to decode data encoded using each of said plurality of code types; and
   providing said data and said associated code type to said allocated programmable parallel decoders.

2. The method of claim 1, further comprising the step of obtaining program code based on said code type from a local memory device for one or more of said programmable parallel decoders.

3. The method of claim 1, further comprising the step of providing control information to one or more of said programmable parallel decoders.

4. The method of claim 1, further comprising the steps of:
   generating a first interleaver table based on said communication standard; and
   dividing said first interleaver table by M to create a second interleaver table having M clusters, wherein each entry in said second interleaver table indicates one of said programmable parallel decoders as a target decoder and a target address for interleaved data.

5. The method of claim 4, further comprising the step of interleaving said data among said programmable parallel decoders.

6. The method of claim 4, further comprising the step of interleaving said data using a communications network.

7. The method of claim 1, further comprising the steps of:
reading data to be decoded;
accessing an interleaver table, wherein each entry in said interleaver table identifies one of said programmable parallel decoders as a target decoder and a target address of a communications network for interleaved data; and
writing said data to said target address of said communications network.

8. The method of claim 7, wherein said communications network comprises one or more of a cross-bar switch and one or more first-in-first-out buffers.

9. The method of claim 7, wherein said programmable parallel decoders decode data encoded using one of a plurality of code types.

10. An apparatus for decoding data encoded using one of a plurality of code types, each of said code types corresponding to a communication standard, said apparatus comprising:
a memory; and
at least one processor, coupled to the memory, operative to:
identify said code type associated with said data;
load program code associated with said identified code type into one or more of a plurality of programmable parallel decoders;
allocate said data to said plurality of programmable parallel decoders, wherein said programmable parallel decoders can be reconfigured to decode data encoded using each of said plurality of code types; and
provide said data and said associated code type to said allocated programmable parallel decoders.

11. The apparatus of claim 10, wherein said processor is further configured to obtain program code based on said code type from a local memory device for one or more of said programmable parallel decoders.

12. The apparatus of claim 10, wherein said apparatus is implemented in one of an integrated circuit, a digital signal processor, a microprocessor, a micro-controller, and a general-purpose computer.

13. The apparatus of claim 10, further operative to:
generate a first interleaver table based on said communication standard for said at least one code type; and
divide said first interleaver table by M to create a second interleaver table having M clusters, wherein each entry in said second interleaver table indicates one of said programmable parallel decoders as a target decoder and a target address for interleaved data.

14. The apparatus of claim 13, wherein said processor is further configured to interleave said data among said programmable parallel decoders using a communications network.

15. The apparatus of claim 13, wherein said apparatus is implemented in one of an integrated circuit, a digital signal processor, a microprocessor, a micro-controller, and a general-purpose computer.

16. The apparatus of claim 10, further operative to:
read data to be decoded;
access an interleaver table, wherein each entry in said interleaver table identifies one of said programmable parallel decoders as a target decoder and a target address of a communications network for interleaved data; and
write said data to said target address of said communications network.

17. The apparatus of claim 16, wherein said communications network comprises one or more of a cross-bar switch and one or more first-in-first-out buffers.

18. The apparatus of claim 16, wherein said apparatus is implemented in one of an integrated circuit, a digital signal processor, a microprocessor, a micro-controller, and a general-purpose computer.

* * * * *